(12) United States Patent
Fukaya et al.

(10) Patent No.: US 10,573,560 B2
(45) Date of Patent: Feb. 25, 2020

(54) WAFER PROCESSING METHOD

(71) Applicant: DISCO CORPORATION, Tokyo (JP)

(72) Inventors: Kota Fukaya, Tokyo (JP); Chae Yong, Tokyo (JP); Zhiwen Chen, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/206,334

(22) Filed: Nov. 30, 2018

(65) Prior Publication Data

US 2019/0172749 A1    Jun. 6, 2019

(30) Foreign Application Priority Data

Dec. 5, 2017  (JP) .................................. 2017-233324

(51) Int. Cl.
| | |
|---|---|
| *H01L 21/78* | (2006.01) |
| *H01L 23/544* | (2006.01) |
| *B23K 26/064* | (2014.01) |
| *B23K 26/046* | (2014.01) |
| *B23K 26/0622* | (2014.01) |
| *B23K 26/00* | (2014.01) |
| *B23K 26/53* | (2014.01) |

(52) U.S. Cl.
CPC .......... *H01L 21/78* (2013.01); *B23K 26/0006* (2013.01); *B23K 26/046* (2013.01); *B23K 26/064* (2015.10); *B23K 26/0624* (2015.10); *B23K 26/53* (2015.10); *H01L 23/544* (2013.01)

(58) Field of Classification Search
CPC ....................................................... H01L 21/78
See application file for complete search history.

(56) References Cited

FOREIGN PATENT DOCUMENTS

JP     2009034723 A    2/2009

*Primary Examiner* — Marvin Payen
(74) *Attorney, Agent, or Firm* — Greer Burns & Crain Ltd.

(57) ABSTRACT

A wafer is divided along a plurality of division lines by applying a laser beam of such a wavelength as to be transmitted through the wafer, to form division start point modified layers along the division lines; and applying an external force to the wafer, to divide the wafer along the division lines, with the division start point modified layers as start points of division. Prior to forming the division start point modified layers on the back surface side of the wafer, the laser beam is applied at an output of not more than a first output, to form crack guide layers for guiding a crack extension direction as modified layers in the vicinity of the back surface. Thereafter the division start point modified layers are formed at positions equivalent to the positions of the crack guide layers.

1 Claim, 4 Drawing Sheets

Modified layer forming step of applying a laser beam of such a wavelength as to be transmitted through the wafer to regions of the wafer corresponding to the division lines at a first output from a surface on one side of the wafer, with a focal point of the laser beam positioned inside the wafer, to form division start point modified layers inside the wafer; and a dividing step of applying an external force to the wafer to divide the wafer along the division lines, with the division start point modified layers as start points of division, after the modified layer forming step is performed. The modified layer forming step includes: a first sub-step of applying the laser beam at an output of not more than the first output, to form crack guide layers for guiding a crack extension direction inside the wafer in a vicinity of the surface on the one side of the wafer, prior to the formation of the division start point modified layers; and a second sub-step of applying the laser beam at the first output, with a focal point of the laser beam positioned at a position which is equivalent to the position of the crack guide layers or which is on the side of a surface on an other side opposite to the surface on the one side of the wafer as compared to the crack guide layers, to form the division start point modified layers and to form cracks communicating with the surface on the one side from the division start point modified layers, after the first sub-step is performed.

WAFER PROCESSING METHOD

BACKGROUND OF THE INVENTION

Field of the Invention

The present invention relates to a wafer processing method for dividing a wafer into individual chips.

Description of the Related Art

As a wafer processing method, there has been proposed a method in which a laser beam of such a wavelength as to be transmitted through a wafer is applied to the wafer to form modified layers inside the wafer, and thereafter an external force is applied to the wafer to divide the wafer into individual chips, with the modified layers as start points of division (see, for example, Japanese Patent No. 4402708). In the processing method described in Japanese Patent No. 4402708, the modified layers are formed along division lines of the wafer, and cracks are extended in the thickness direction of the wafer, to expose the cracks to a front surface or a back surface of the wafer. Then, the wafer is pressed toward an extending side of the cracks, whereby the wafer is divided smoothly.

SUMMARY OF THE INVENTION

In the case of a wafer of a non-crystalline material, particularly a glass or the like, however, the cracks may not extend rectilinearly from the modified layers toward the front surface or the back surface of the wafer, and the cracks exposed to the front surface side or the back surface side of the wafer may meander, thereby leading to a problem that the wafer cannot be divided accurately.

It is therefore an object of the present invention to provide a wafer processing method by which even a wafer of a non-crystalline material or the like can be divided into individual chips without meandering.

In accordance with an aspect of the present invention, there is provided a wafer processing method for processing a wafer on which a plurality of intersecting division lines are set. The wafer processing method includes: a modified layer forming step of applying a laser beam of such a wavelength as to be transmitted through the wafer to regions of the wafer corresponding to the division lines at a first output from a surface on one side of the wafer, with a focal point of the laser beam positioned inside the wafer, to form division start point modified layers inside the wafer; and a dividing step of applying an external force to the wafer to divide the wafer along the division lines, with the division start point modified layers as start points of division, after the modified layer forming step is performed. The modified layer forming step includes: a first sub-step of applying the laser beam at an output of not more than the first output, to form crack guide layers for guiding a crack extension direction inside the wafer in a vicinity of the surface on the one side of the wafer, prior to the formation of the division start point modified layers; and a second sub-step of applying the laser beam at the first output, with a focal point of the laser beam positioned at a position which is equivalent to the position of the crack guide layers or which is on the side of a surface on an other side opposite to the surface on the one side of the wafer as compared to the crack guide layers, to form the division start point modified layers and to form cracks communicating with the surface on the one side from the division start point modified layers, after the first sub-step is performed.

According to this configuration, after the crack guide layers are formed in the vicinity of the surface on one side of the wafer, the division start point modified layers are formed at positions which are equivalent to the positions of the crack guide layers or on the side of the surface on the other side as compared to the crack guide layers. When the cracks extend from the division start point modified layers toward the side of the surface on the one side of the wafer, meandering of the cracks is restrained by the guiding by the crack guide layers. Therefore, the cracks can be formed along the division lines, and even a wafer of which the crystal orientation is random such as a wafer of a non-crystalline material can be divided in a favorable manner.

According to the present invention, the crack guide layers are formed inside the wafer in the vicinity of the surface on one side, before the formation of the division start point modified layers, whereby even a wafer of a non-crystalline material or the like can be divided without meandering.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
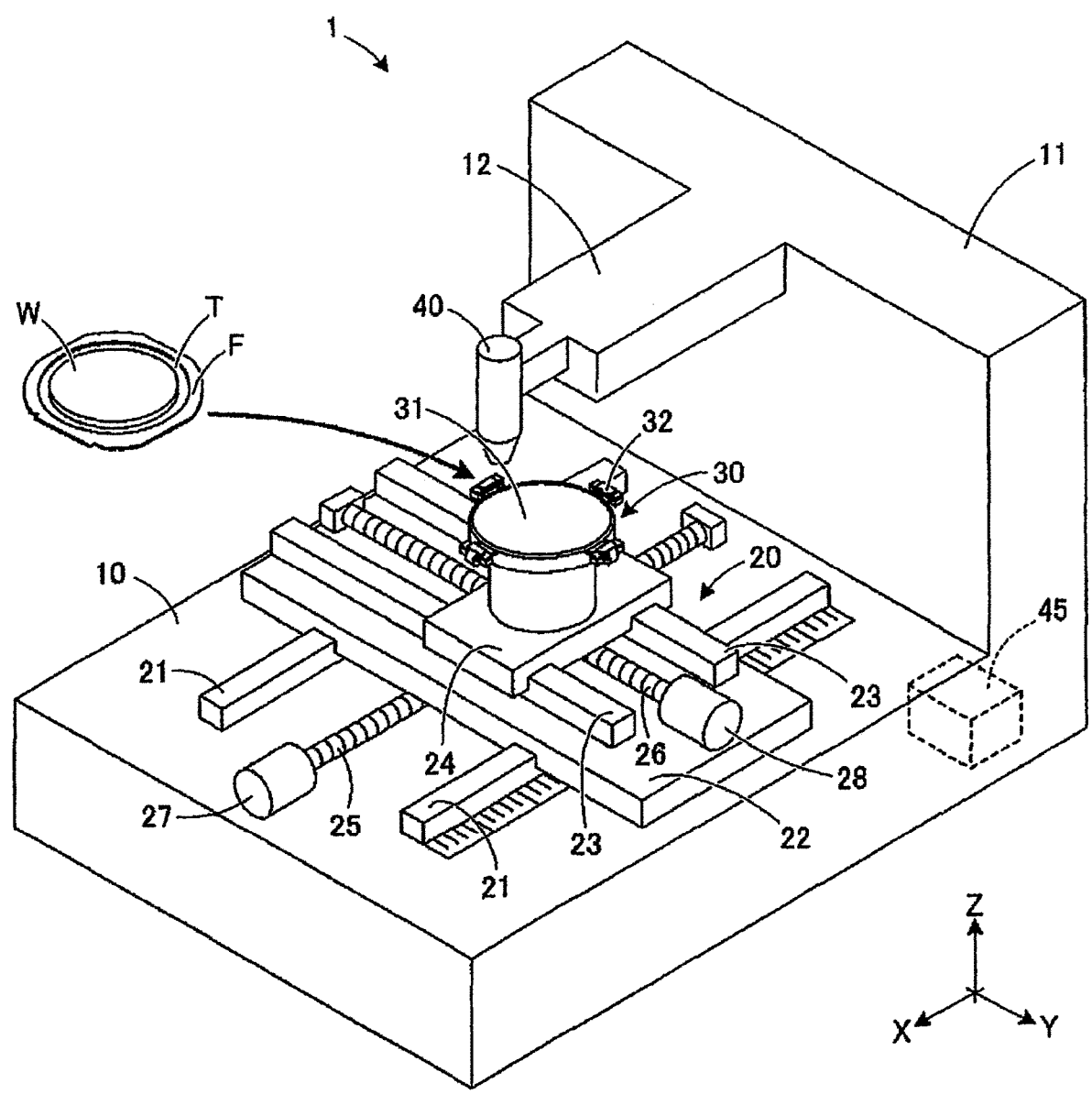
FIG. 1 is a perspective view of a laser processing apparatus according to an embodiment of the present invention.
Figure 2A:
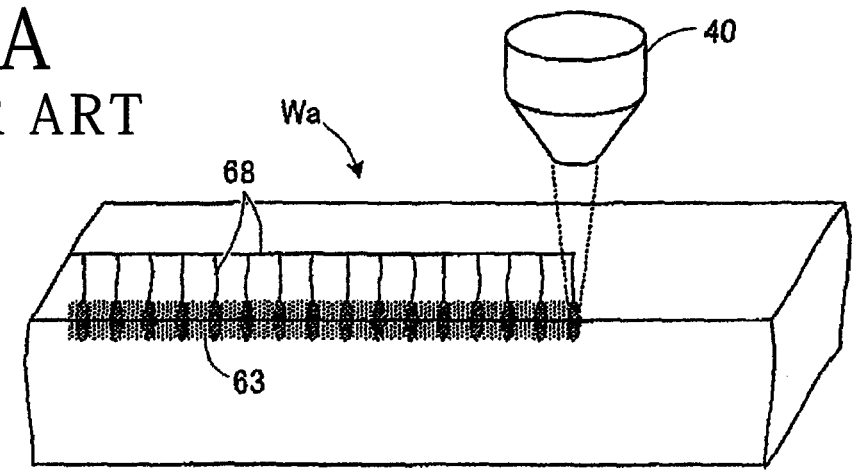
FIGS. 2A to 2C are illustrations of laser processing of a comparative example.
Figure 2B:
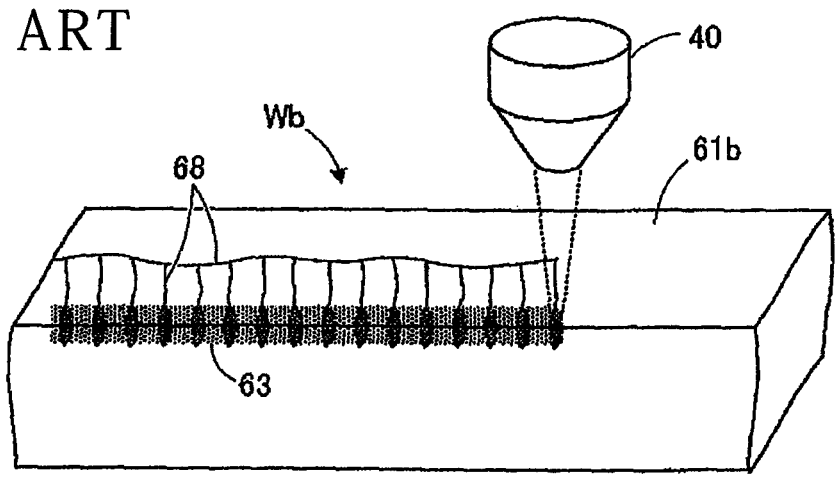
Figure 2C:
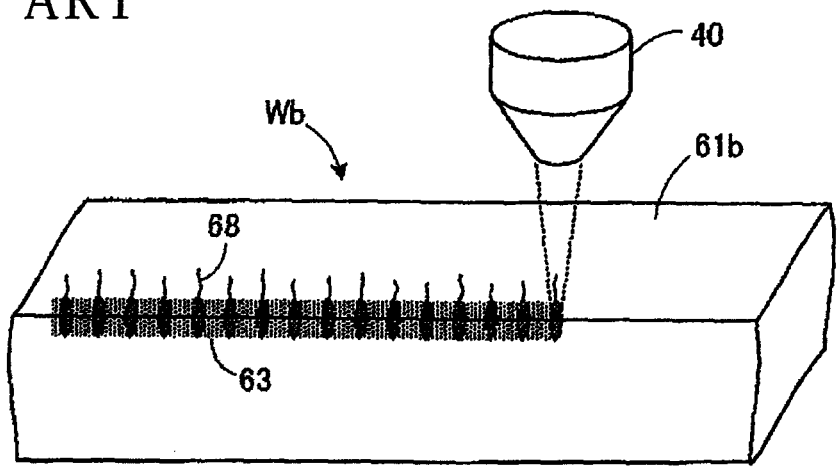

Referring to the attached drawings, a laser processing apparatus according to an embodiment of the present invention will be described below. FIG. 1 is a perspective view of the laser processing apparatus according to the present embodiment. FIGS. 2A to 2C are illustrations of laser processing of a comparative example. Note that the laser processing apparatus need only have such a configuration as to be able to carry out the wafer processing method according to the present embodiment, and is therefore not limited to the configuration depicted in FIG. 1.

As illustrated in FIG. 1, the laser processing apparatus 1 has a configuration in which a processing head 40 for applying a laser beam and a holding table 30 with a wafer W held thereon are relatively moved, thereby laser processing the inside of the wafer W. A plurality of division lines (not depicted) are arranged on a front surface (a surface on the other side) of the wafer W, and a device is formed in each of regions partitioned by the plurality of division lines. The wafer W is supported on a ring frame F through a dicing tape T. Note that the wafer W is not particularly limited, and may be one that is to be formed therein with modified layers by application of a laser beam.

On a base 10 of the laser processing apparatus 1, a table moving mechanism 20 is provided which moves the holding table 30 in an X-axis direction and a Y-axis direction relative to the processing head 40. The table moving mechanism 20 includes a pair of guide rails 21 disposed on the base 10 in parallel to the X-axis direction, and a motor-driven X-axis table 22 slidably disposed on the pair of guide rails 21. In addition, the table moving mechanism 20 includes a pair of guide rails 23 disposed on an upper surface of the X-axis table 22 in parallel to the Y-axis direction, and a motor-driven Y-axis table 24 slidably disposed on the pair of guide rails 23.

The X-axis table 22 and the Y-axis table 24 are individually formed with nut sections (not depicted) on their back side, and ball screws 25 and 26 are in screw engagement with these nut sections. When driving motors 27 and 28 connected to one-side ends of the ball screws 25 and 26 are rotationally driven, the holding table 30 is thereby moved in the X-axis direction and the Y-axis direction along the guide rails 21 and 23. In addition, on the Y-axis table 24 is provided the holding table 30 that holds the wafer W. A holding surface 31 is formed at an upper surface of the holding table 30, and clamp sections 32 for clamping and fixing the ring frame F at the periphery of the wafer W are provided in the periphery of the holding table 30.

An arm section 12 is projectingly provided on a vertical wall section 11 on a rear side of the holding table 30, and the processing head 40 for laser processing the wafer W on the holding table 30 is provided at a tip of the arm section 12. The processing head 40 applies a laser beam of such a wavelength as to be transmitted through the wafer W to the wafer W from the side of a back surface (a surface on one side) of the wafer W, to form modified layers 63 (see FIGS. 2A to 2C) along the division lines. The modified layer 63 refers to a region where the inside of the wafer W is brought, by application of the laser beam, into a state of being different from the surroundings in density, refractive index, mechanical strength or other physical property, and where strength is lowered as compared to the surroundings. Besides, the modified layer 63 is, for example, a melting treatment region, a crack region, a dielectric breakdown region, or a refractive index change region, and may be a region where these are present in a mixed manner.

In addition, the laser processing apparatus 1 is provided with a control unit 45 for supervisory control of the components thereof. The control unit 45 includes a processor for executing various kinds of processing, a memory and the like. The memory is composed of one or a plurality of storage media such as a read only memory (ROM) and a random access memory (RAM). The memory stores not only a control program for controlling the components of the laser processing apparatus 1 but also processing conditions for the laser processing, and the like. With the holding table 30 moved in a processing feeding direction relative to the processing head 40, the modified layer 63 is formed inside the wafer W along the division line.

As depicted in FIG. 2A, at the time of forming modified layers 63 as start points of division in a wafer Wa by laser processing, in general, cracks 68 are extended along the crystal orientation of the wafer Wa such as to restrain meandering. Therefore, it is normally necessary to make a recipe according to the crystal orientation of the wafer Wa. If the wafer W is a silicon wafer in which the crystal orientation is aligned, the cracks 68 can be extended rectilinearly inside the wafer Wa by applying a laser beam according to the crystal orientation. If the wafer W is of a wafer of a non-crystalline material such as a glass wafer, however, the crystal orientation is random and, therefore, it is impossible to perform laser processing according to the crystal orientation.

As illustrated in FIG. 2B, when modified layers 63 are formed in a wafer Wb of a non-crystalline material by a laser beam at a normal output, the cracks 68 would meander and, therefore, it is impossible to divide the wafer Wb in a favorable manner. As depicted in FIG. 2C, when the output is suppressed for restraining the meandering of the cracks 68, the cracks 68 would not extend from the modified layers 63 to a back surface 61b of the wafer Wb, making it impossible for the modified layers 63 to serve as start points of division of the wafer Wb. Thus, there is a need for a laser processing method which is suited to the wafer Wb of a non-crystalline material.

Figure 3A:
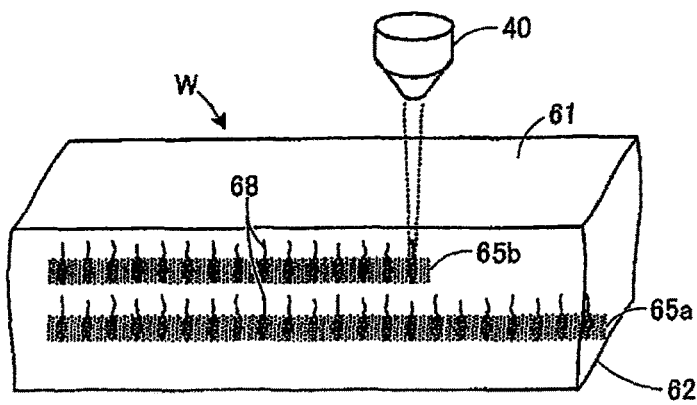
FIGS. 3A to 3D are illustrations of a wafer processing method according to an embodiment of the present invention.
Figure 3B:
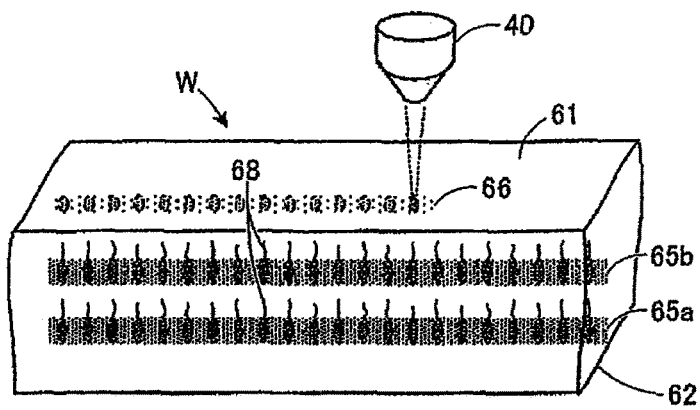
Figure 3C:
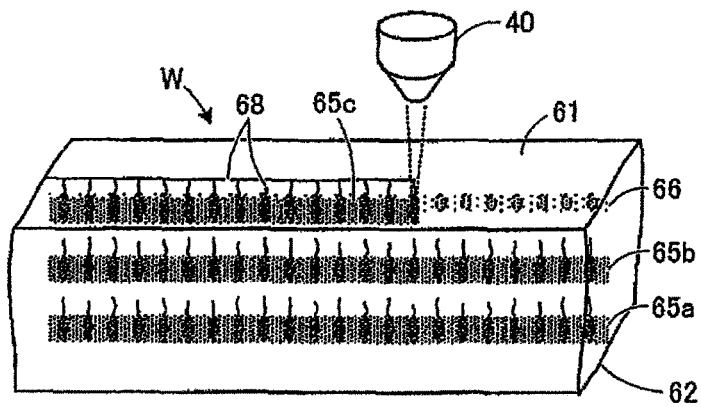

In view of this, in the present embodiment, in addition to division start point modified layers 65 (65a and 65b) as modified layers to be start points of division, crack guide layers 66 as modified layers to be guides for the cracks 68 are formed (see FIGS. 3B and 3C). Prior to the formation of the division start point modified layers 65, the crack guide layers 66 are formed on a back surface 61 side as compared to the position where to form the division start point modified layers 65, whereby the cracks 68 extending from the division start point modified layers 65 to the back surface 61 side of the wafer W are guided by the crack guide layers 66. With the cracks 68 extended along the crack guide layers 66, meandering of the cracks 68 reaching the back surface 61 of the wafer W is restrained, and the wafer W can be divided in a satisfactory manner.

Figure 3D:
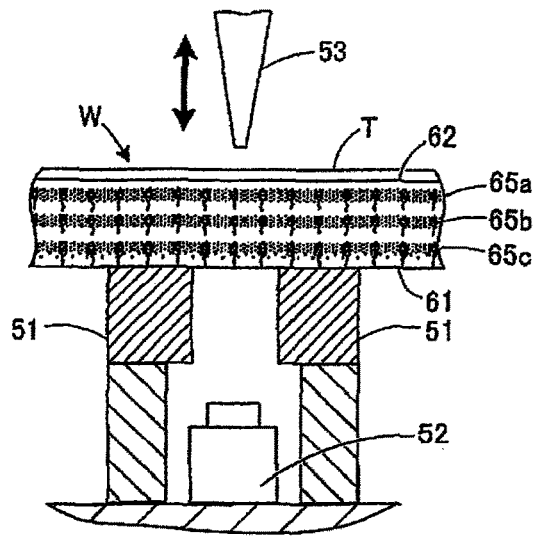

The wafer processing method will be described below. FIGS. 3A to 3D are illustrations of the wafer processing method according to the present embodiment. FIGS. 3A to 3C depict an example of a modified layer forming step, and FIG. 3D depicts an example of a dividing step.

As illustrated in FIG. 3A, a modified layer forming step is first carried out. In the modified layer forming step, the division start point modified layers 65 to be start points of division of the wafer W are formed inside the wafer W. In this case, the wafer W is held on the holding table 30 through the dicing tape T (see FIG. 1), and an emission port of the processing head 40 is positioned at the division line of the wafer W. In addition, a laser beam of such a wavelength as to be transmitted through the wafer W is applied to a region corresponding to the division line from the back surface 61 side of the wafer W at a first output, with a focal point of the laser beam positioned in the vicinity of a front surface 62 of the wafer W.

With the processing head 40 moved relative to the wafer W, a division start point modified layer 65a along the division line is formed inside the wafer W, and a crack 68 is formed from the division start point modified layer 65a toward the bask surface 61 side. When a first division start point modified layer 65a is formed in the vicinity of the front surface 62 of the wafer W, the height of the focal point is moved upward and thereafter laser processing is conducted along the division line, whereby a second division start point modified layer 65b is formed inside the wafer W. In this way, application of the laser beam along the division line is repeated each time the height of the focal point is moved upward, whereby a plurality of division start point modified layers 65a and 65b are formed inside the wafer W.

Note that processing conditions for forming the division start point modified layers 65 in the modified layer forming step are set, for example, as follows.

Wafer: glass substrate, φ8 inch×5 mm
Kind of laser: solid-state laser
Wavelength: wavelength [μm] such as to be transmitted through glass substrate Repetition frequency: 50 [kHz]
Output: 0.8 [W]
Processing feeding speed: 700 [mm/sec]
Processing depth: 37 [μm] from upper surface Next, prior to the formation of uppermost division start point modified layers 65c (see FIG. 3C) in the wafer W, as depicted in FIG. 3B, crack guide layers 66 for guiding the extension direction of cracks 68 are formed inside the wafer W in the vicinity of the back surface 61. In this case, the emission port of the processing head 40 is positioned at the division line, and the focal point of the laser beam of such a wavelength as to be transmitted through the wafer W is positioned inside the wafer W in the vicinity of the back surface 61. In addition, the output condition of the laser processing is varied, and a laser beam at a second output lower than the first output is applied to a region of the wafer W corresponding to the division line from the back surface 61 side of the wafer W.

With the processing head 40 moved relative to the wafer W, the crack guide layer 66 along the division line is formed in the vicinity of the back surface 61 of the wafer W. The crack guide layer 66 may be formed by a laser beam at a low output such that the crack 68 is not generated, or may be formed by a laser beam at a low output such that the crack 68 does not reach the back surface 61 of the wafer W. In addition, the crack guide layer 66 need only be formed such as to be able to guide the extension direction of the crack 68; for example, the crack guide layer 66 may be formed by a laser beam of the same output as the first output used at the time of forming the division start point modified layer 65.

Note that processing conditions for forming the crack guide layers 66 in the modified layer forming step are set, for example, as follows.

Kind of laser: solid-state laser
Wavelength: wavelength [μm] such as to be transmitted through glass substrate
Repetition frequency: 50 [kHz]
Output: 0.5 [W]
Processing feeding speed: 700 [mm/sec]
Processing depth: 32 [μm] from upper surface Subsequently, as depicted in FIG. 3C, after the formation of the crack guide layers 66 inside the wafer W in the vicinity of the back surface 61, division start point modified layers 65c are formed at a position (height position or depth position) slightly deeper than the crack guide layers 66. In this case, the emission port of the processing head 40 is positioned at the division line of the wafer W, and the focal point of a laser beam of such a wavelength as to be transmitted through the wafer W is positioned at a position equivalent to the position of the crack guide layers 66, or a position overlapping the crack guide layers 66. In addition, the output condition of the laser processing is returned to the original one, and the laser beam is applied to a region of the wafer W that corresponds to the division line, at the first output, from the side of the back surface 61 opposite to the front surface 62.

Then, with the processing head 40 moved relative to the wafer W, the division start point modified layer 65c is formed such as to overlap the crack guide layer 66, and a crack 68 communicating with the back surface 61 of the wafer W from the division start point modified layer 65c is formed. The cracks 68 are extended from the division start point modified layers 65c along the crack guide layers 66 and are guided to the back surface 61 of the wafer W. As a result, meandering of the cracks 68 at the back surface 61 of the wafer W is restrained, and the cracks 68 along the division lines are formed. By the cracks 68 reaching the back surface 61 of the wafer W from the division start point modified layers 65c, the back surface 61 side of the wafer W is half-cut.

In this way, in the modified layer forming step, prior to the formation of the division start point modified layers 65c, the crack guide layers 66 are formed on the back surface 61 side as compared to the positions where to form the division start point modified layers 65c, whereby the crack guide layers 66 are made to function as guides for the cracks 68. Note that the division start point modified layer 65c is not limited to the configuration of being formed by positioning the focal point of the laser beam at a position equivalent to the position of the crack guide layers 66. The division start point modified layer 65c may be formed by positioning the focal point of the laser beam on the front surface 62 side as compared to the crack guide layers 66. It is to be noted, however, that the focal point of the laser beam may not necessarily be set to overlap the crack guide layers 66, but is adjusted to such a height as not to overlap the second layer of the division start point modified layers 65b.

Next, as depicted in FIG. 3D, a dividing step is carried out after the modified layer forming step is performed. In the dividing step, an external force is applied to the wafer W, whereby the wafer W is divided along the division lines, with the division start point modified layers 65a to 65c as start points of division. In this case, the wafer W is placed on a pair of support bases 51 of a breaking apparatus (not depicted), with the back surface 61 of the wafer W faced down. The pair of support bases 51 extend in one direction (the direction perpendicular to the paper surface), and an imaging unit 52 is disposed between the pair of support bases 51. The division lines (the division start point modified layers 65) of the wafer W are imaged through a space between the pair of support bases 51 by the imaging unit 52.

A pressing blade 53 is disposed above the pair of support bases 51 along the extending direction of the support bases 51, and the pressing blade 53 is positioned at one division line of the wafer W, based on the results of imaging by the imaging unit 52. Then, the pressing blade 53 is pressed against the wafer W through the dicing tape T, whereby an external force is applied to the division start point modified layer 65 and the wafer W is broken up. After the wafer W is broken up along one division line, the pressing blade 53 is positioned at the adjacent division line, and breaking-up along the adjacent division line is conducted. This breaking-up operation is repeated, whereby the wafer W is divided into individual chips.

Experimental Example

Figure 4A:
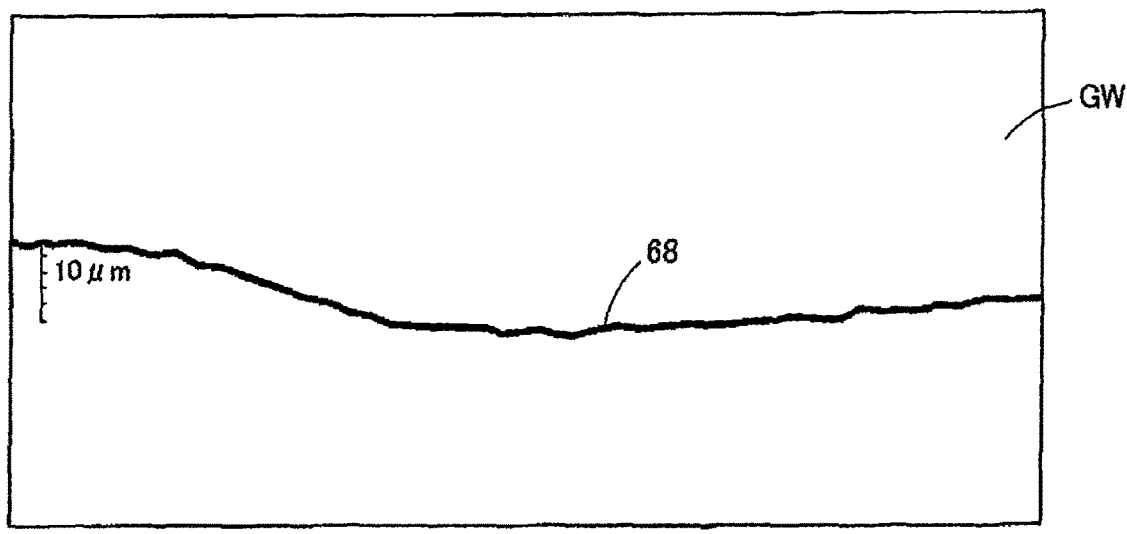
FIGS. 4A and 4B are drawings depicting cracks on a back side of a wafer in experimental examples.
Figure 4B:
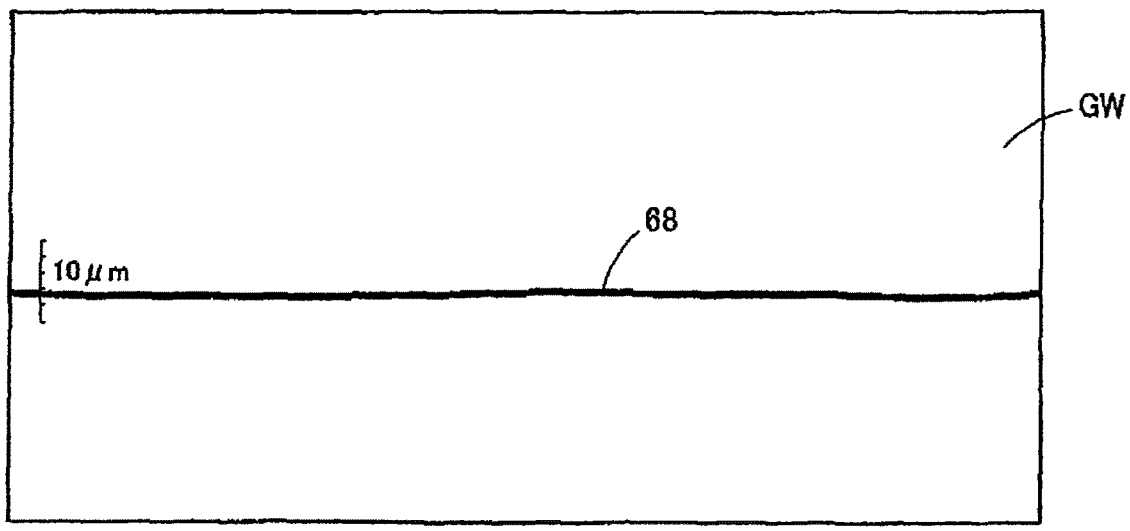

An experimental example will be described below. In the experimental example, a meandering amount of cracks was measured, for a case where only division start point modified layers are formed in a glass wafer GW and a case where crack guide layers are formed in the glass wafer GW prior to the formation of division start point modified layers. As illustrated in FIG. 4A, in the case where the crack guide layers were not formed in the glass wafer GW, the meandering amount of the cracks 68 generated at the back surface of the glass wafer GW was 10 μm. On the other hand, as depicted in FIG. 4B, in the case where the crack guide layers were formed in the glass wafer GW, the meandering amount of the cracks 68 generated at the back surface of the glass wafer GW was 3 μm. In this way, it was confirmed that the meandering of the cracks 68 can be sufficiently restrained by extending the cracks 68 along the crack guide layers.

As has been described above, according to the processing method for the wafer W of the present embodiment, after the formation of the crack guide layers 66 in the vicinity of the back surface 61 of the wafer W, the division start point modified layers 65c are formed at positions equivalent to the positions of the crack guide layers 66 or at positions on the front surface 62 side as compared to the crack guide layers 66. When the cracks extend from the division start point modified layers 65c to the back surface 61 side of the wafer W, meandering of the cracks 68 is restrained by the guiding by the crack guide layers 66. Therefore, the cracks 68 can be formed along the division lines, so that even a wafer of which the crystal orientation is random, such as a wafer of a non-crystalline material, can be divided in a satisfactory manner.

Note that while a configuration in which the laser beam is applied to the wafer at the second output lower than the first output, at the time of forming the crack guide layers in the modified layer forming step, has been adopted in the present embodiment, this configuration is not limitative. The output at which the laser beam is applied to the wafer for forming the crack guide layers need only be not more than the first output, and the laser beam may be applied to the wafer at the first output to thereby form the crack guide layers.

In addition, while a configuration in which the three layers of the division start point modified layers are formed in the modified layer forming step has been adopted in the present embodiment, this configuration is not restrictive. It is only necessary that in the modified layer forming step, one or more layers of the division start point modified layers should be formed on the back surface side of the wafer after the formation of the crack guide layers; for example, only one layer of the division start point modified layers may be formed, or four or more layers of the division start point modified layers may be formed.

Besides, while a configuration in which the crack guide layers and the division start point modified layers are formed on the back surface side of the wafer by applying the laser beam from the back surface of the wafer has been adopted in the present embodiment, this configuration is not limitative. The crack guide layers and the division start point modified layers may be formed on the front surface side of the wafer by applying the laser beam from the front surface side of the wafer.

In addition, while a configuration in which the wafer is divided by breaking (breaking-up) in the dividing step has been adopted in the present embodiment, this configuration is not restrictive. In the dividing step, any configuration in which an external force is applied to the wafer to divide the wafer, with the division start point modified layers as start points of division, may be adopted. For example, a configuration in which the dicing tape is expanded by tape expanding to apply tensile forces to the wafer, thereby dividing the wafer, may be adopted. Besides, a configuration in which the back surface of the wafer is ground by dicing before grinding (DBG) to thereby apply a grinding pressure to the wafer, thereby dividing the wafer, may also be adopted.

Besides, while the method of processing a wafer of a non-crystalline material has been limitatively adopted in the present embodiment, the wafer to be processed is not restricted to the wafer of a non-crystalline material. Therefore, as the wafer to be processed, various workpieces such as a semiconductor substrate, an inorganic material substrate, and a package substrate may be used. As the semiconductor substrate, various substrates of silicon, gallium arsenide, gallium nitride, silicon carbide and the like may be used. As the inorganic material substrate, various substrates of sapphire, ceramics, glass and the like may be used. The semiconductor substrate and the inorganic material substrate may be formed with devices or may not be formed with devices. As the package substrate, various substrates for chip size package (CSP), wafer level chip size package (WLCSP), electromagnetic interference (EMI), system in package (SIP), or fan out wafer level package (FOWLP) may be used. Besides, as the wafer, lithium tantalate, lithium niobate, and, further, green ceramics and piezoelectric elements, before or after formation of devices, may be used.

While the present embodiment and modifications thereof have been described above, other embodiments of the present invention may include embodiments obtained by combining, entirely or partly, the present embodiment and the modifications thereof.

In addition, the embodiments and modifications thereof of the present invention are not limited to the above-described embodiment, and various changes, replacements and/or modifications may be made without departing from the gist of the technical thought of the invention. Further, if the technical thought of the present invention can be realized in other ways by the progress of technology or by other derivative technologies, the invention may be carried out by the other relevant method. Therefore, the scope of the claims coves all the embodiments that are included in the scope of the technical thought of the present invention.

Besides, while a configuration in which the present invention is applied to division of a wafer along division lines has been described in the present embodiment, the invention is also applicable to division of other workpiece to be divided through formation of modified layers.

As has been described above, the present invention has an effect that even a wafer of a non-crystalline material can be divided without meandering, and the invention is especially useful for a wafer processing method for dividing a glass wafer into individual chips.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A wafer processing method for processing a wafer on which a plurality of intersecting division lines are set, the wafer processing method comprising:

a modified layer forming step of applying a laser beam of such a wavelength as to be transmitted through the wafer to regions of the wafer corresponding to the division lines at a first output from a surface on one side of the wafer, with a focal point of the laser beam positioned inside the wafer, to form division start point modified layers inside the wafer; and a dividing step of applying an external force to the wafer to divide the wafer along the division lines, with the division start point modified layers as start points of division, after the modified layer forming step is performed, wherein the modified layer forming step includes a first sub-step of applying the laser beam at an output of not more than the first output, to form crack guide layers for guiding a crack extension direction inside the wafer in a vicinity of the surface on the one side of the wafer, prior to the formation of the division start point modified layers, and a second sub-step of applying the laser beam at the first output, with a focal point of the laser beam positioned at a position which is equivalent to the position of the crack guide layers or which is on the side of a surface on an other side opposite to the surface on the one side of the wafer as compared to the crack guide layers, to form the division start point modified layers and to form cracks communicating with the surface on the one side from the division start point modified layers, after the first sub-step is performed.

\* \* \* \* \*